US012731979B2

(12) United States Patent
Petenyi et al.

(10) Patent No.: US 12,731,979 B2
(45) Date of Patent: Sep. 8, 2026

(54) METHOD AND APPARATUS FOR PROPER RECOGNITION OF OVERLOAD CONDITION IN A POWER DEVICE

(71) Applicant: STMicroelectronics International N.V., Geneva (CH)

(72) Inventors: Sandor Petenyi, Lysa and Labem (CZ); Giuseppina Bille', Gravina di Catania (IT)

(73) Assignee: STMicroelectronics International, Geneva (CH)

(*) Notice: Subject to any disclaimer, the term of this patent is extended or adjusted under 35 U.S.C. 154(b) by 190 days.

(21) Appl. No.: 18/675,531

(22) Filed: May 28, 2024

(65) Prior Publication Data

US 2025/0373001 A1 Dec. 4, 2025

(51) Int. Cl.
*H02H 3/093* (2006.01)
*H01H 85/30* (2006.01)
*H02H 1/00* (2006.01)
*H03K 17/0812* (2006.01)

(52) U.S. Cl.
CPC ............ *H02H 3/093* (2013.01); *H01H 85/30* (2013.01); *H02H 1/0007* (2013.01); *H03K 17/08122* (2013.01); *H03K 2217/0027* (2013.01); *H03K 2217/0081* (2013.01)

(58) Field of Classification Search
CPC ...... H01H 85/30; H02H 1/0007; H02H 3/087; H02H 3/093; H02H 7/1213; H03K 17/08122; H03K 2217/0027; H03K 2217/0081
USPC ........................................................ 361/93.1
See application file for complete search history.

(56) References Cited

U.S. PATENT DOCUMENTS 7,619,865 B2 * 11/2009 Thiery .................. H02H 3/093 361/93.1
8,686,596 B2 4/2014 Huss et al.
10,530,356 B2 * 1/2020 Li ...................... H03K 17/0822
2013/0069714 A1 * 3/2013 Kim .................. H10D 30/6741 327/541
2015/0263514 A1 * 9/2015 Koishi ............... H03K 17/0828 361/93.7

(Continued)

FOREIGN PATENT DOCUMENTS

DE 102017101387 A1 * 7/2017 ....... H03K 17/08122
JP H10224196 A * 8/1998

OTHER PUBLICATIONS

Machine translation of Mitsuda et al. Japanese Patent Document JP H10-224196 A Aug. 1998 (Year: 1998).*

(Continued)

*Primary Examiner* — Kevin J Comber
(74) *Attorney, Agent, or Firm* — Crowe & Dunlevy LLC

(57) ABSTRACT

Disclosed herein is circuitry for protecting a power supply system from overcurrent conditions by monitoring an input voltage and an output voltage of the power supply system, detecting an overcurrent condition based on the monitored input and output voltages, and determining whether the overcurrent condition is caused by an input transient or an output short circuit. When the detected overcurrent condition is caused by an input transient, a gate of a power transistor is controlled to maintain current flow to a load. When the detected overcurrent condition is caused by an output short circuit, the power transistor is turned off to protect the power supply system.

12 Claims, 4 Drawing Sheets

(56) References Cited

U.S. PATENT DOCUMENTS

| | | | | |
|---|---|---|---|---|
| 2019/0056131 | A1 | 2/2019 | Warren et al. | |
| 2020/0169077 | A1 * | 5/2020 | Egelhof | H02H 7/205 |
| 2021/0242864 | A1 * | 8/2021 | Okada | H02M 3/156 |
| 2023/0187922 | A1 * | 6/2023 | Randazzo | H02H 5/048 361/87 |
| 2023/0308088 | A1 * | 9/2023 | Iwai | H02M 1/32 |
| 2024/0072530 | A1 | 2/2024 | Forejtek et al. | |

OTHER PUBLICATIONS

Machine translation of Maehara et al. German Patent Document DE 102017101387 A1 Jul. 2017 (Year: 2017).*

Analog Devices Data Sheet, "High Voltage Positive Hot Swap Controller and Digital Power Monitor with PMBus," ADM1272, 2017-2020, 57 pgs.

Marroqui, David, et al.: "LVDC SiC MOSFET Analog Electronic Fuse With Self-Adjusting Tripping Time Depending on Overcurrent Condition," IEEE Transactions on Industrial Electronics, vol. 69, No. 8, Aug. 2022, 9 pgs.

* cited by examiner 100
110
SUPPLY
VIN
120
CHARGE PUMP
122
CPOUT
123
FAULT_RESET
124
POWER DETECTOR
PULLUP_BOOST
I
PG_FLAG
121
FAULT MEMORY
129
SHUT_DOWN
GATE CONTROL
GCTRL
NP
SHUT_DOWN
R1
VGS_LOW_FLAG
VGS DETECTOR
VG
NP1
AND1
125
IOUT
127
PULLUP_BOOST
OR1
NP2
STATE MACHINE
GS_SWITCH
VS
SENSED_VOUT
OCP_FLAG
126
OVERCURRENT DETECTOR
VOUT_DROP_FLAG
VOUT DROP DETECTOR
VOUT
128
CONTROLLER
Rload
Cout
FUSE
140
LOAD

METHOD AND APPARATUS FOR PROPER RECOGNITION OF OVERLOAD CONDITION IN A POWER DEVICE

TECHNICAL FIELD

The present disclosure relates to the field of power electronics, specifically to protection mechanisms for power transistors. More particularly, the present disclosure pertains to an electronic fuse employing a protection scheme that accurately differentiates between stressing conditions stimulated by input and output factors, and that then applies an appropriate response to maintain the integrity and reliability of the power transistor while ensuring optimal performance.

BACKGROUND

In the field of power devices, the protection of power transistors is of particular concern. Power transistors are inherently subjected to various stressing conditions that can originate from either the supply side (input) or the load side (output). These stressing conditions can lead to scenarios where the device is at risk of damage or failure if appropriate mitigating actions are not taken.

One of the most concerning stressing conditions faced by power transistors is the occurrence of large currents. These large currents can be stimulated by events on both the input and output sides of the power device. When the stimulation of large currents originates from the input side, it is typically associated with scenarios such as transients along the input voltage line, switching of the power supply from one source to another (e.g., from a Power Supply Unit to a battery), or the connection and disconnection of additional power devices on a common input voltage rail. While these conditions can be stressing, they do not necessarily indicate a direct threat to the integrity of the power device. In these instances, the power transistor can be designed to continue its operation without the need for shutdown, providing for uninterrupted power management.

On the other hand, when large output currents are stimulated from the output side, it is indicative of more concerning conditions that could directly threaten the operational integrity of the power transistor. These conditions include output voltage overload, short circuits, or general overload situations. Under these circumstances, the appropriate response mechanism involves shutting off the power transistor to prevent damage or failure.

Current strategies for distinguishing between these input and output stimulated conditions and implementing the correct response mechanisms are not sufficient in some applications.

FIG. 1 (prior art) illustrates a typical circuit arrangement 10 for powering a load 30. The electronic fuse 20, including power transistor NP, is connected between the supply voltage VIN and the load 30. A bulk capacitance Cbulk is connected between a node located between the fuse 20 and the load 30 and ground. While the fuse 20 provides some level of protection against excessive output currents, it has limitations in distinguishing between input and output stimulated conditions because the fuse's response is solely based on the magnitude of the current delivered to the load 30, regardless of its origin. This lack of distinction can lead to unnecessary shutdowns in scenarios where the stimulation resulting in the excess current originated at the input side.

Therefore, there is a need for an improved protection mechanism for power transistors that can accurately differentiate between input and output stimulated stressing conditions and accordingly apply the appropriate response (continue operation or shutdown).

SUMMARY

Disclosed herein is a power supply system including a power transistor having a first conduction terminal coupled to an input node configured to receive an input voltage, a second conduction terminal coupled to an output node configured to generate an output voltage, and a control terminal configured to receive a gate control signal. The power supply system further includes a first shut-down transistor having a first conduction terminal coupled to the control terminal of the power transistor, a second conduction terminal coupled to ground, and a control terminal configured to receive a shut down signal, and a second shut-down transistor having a first conduction terminal coupled to the control terminal of the power transistor, a second conduction terminal coupled to the output node, and a control terminal. A current source is configured to source current to the control terminal of the power transistor in response to assertion of a pullup boost signal. A power detector is configured to assert a power-good flag when a voltage across the current source is at a minimum threshold. A gate-to-source voltage detector configured to assert a low gate-to-source voltage flag when a gate-to-source voltage of the power transistor is below a gate-to-source threshold. An overcurrent detector is configured to assert an overcurrent protection flag based upon sensing an output current sourced by the power transistor to the output node. An output voltage drop detector is configured to assert an output voltage drop flag when the output voltage has fallen below a sampled output voltage by an offset. A first logic circuit has a first input coupled to receive the output voltage drop flag, a second input coupled to receive a sensed output voltage flag, and an output. A fault indication circuit is configured to assert the shut down signal in response to assertion of the output of the first logic circuit. A gate control circuit is configured to generate the gate control signal as being asserted when the shut down signal is deasserted but as being deasserted when the shut down signal is asserted. A state machine is configured to generate the pullup boost signal, a gate-to-source switch signal, and a sensed output voltage flag based upon the low gate-to-source-voltage flag, the power-good flag, and the overcurrent protection flag. A second logic circuit has a first input coupled to receive the gate-to-source switch signal, a second input coupled to receive the shut down signal, and an output coupled to the control terminal of second shut-down transistor.

Also disclosed herein is a method for protecting a power supply system from overcurrent conditions. The method includes monitoring an input voltage and an output voltage of the power supply system, detecting an overcurrent condition based on the monitored input and output voltages, and determining whether the overcurrent condition is caused by an input transient or an output short circuit. When the detected overcurrent condition is caused by an input transient, the method includes controlling a gate of a power transistor to maintain current flow to a load. When the detected overcurrent condition is caused by an output short circuit, the method includes turning off the power transistor to protect the power supply system.

Also disclosed herein is a power supply system including a power supply providing an input voltage, a load receiving an output voltage, and an electronic fuse controlling current flow from the power supply to the load. The electronic fuse includes a power transistor having a drain connected to the power supply, a source connected to the load, and a gate, and a state machine receiving a power-good flag, a gate-to-source voltage low flag, and an overcurrent protection flag as inputs, and asserting or deasserting a sensed output voltage signal and a gate-source switch signal based on the inputs. The electronic fuse further includes an output voltage drop detector asserting or deasserting an output voltage drop flag based on the output voltage and the sensed output voltage signal, and gate control circuitry controlling the gate of the power transistor based on a shut down signal. The state machine and output voltage drop detector cooperate to distinguish between overcurrent conditions caused by input transients and overcurrent conditions caused by output short circuits.

Further disclosed herein is a method for distinguishing between overcurrent conditions in a power supply system. The method includes detecting an overcurrent condition and asserting an overcurrent protection flag, asserting a sensed output voltage signal and a gate-source switch signal to discharge a gate of a power transistor, detecting a gate-to-source voltage of the power transistor below a threshold and asserting a gate-to-source voltage low flag, charging the gate of the power transistor in response to the gate-to-source voltage low flag, detecting a drop in output voltage while the sensed output voltage signal is asserted and asserting an output voltage drop flag, and shutting down the power transistor if the output voltage drop flag is asserted while the sensed output voltage signal is asserted.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Note that in the following description, any resistor or resistance mentioned is a discrete device, unless stated otherwise, and is not simply an electrical lead between two points. Therefore, any resistor or resistance connected between two points has a higher resistance than a lead between those two points, and such resistor or resistance cannot be interpreted as a lead. Similarly, any capacitor or capacitance mentioned is a discrete device, unless stated otherwise, and is not a parasitic element, unless stated otherwise. Additionally, any inductor or inductance mentioned is a discrete device, unless stated otherwise, and is not a parasitic element, unless stated otherwise.

Figure 1:
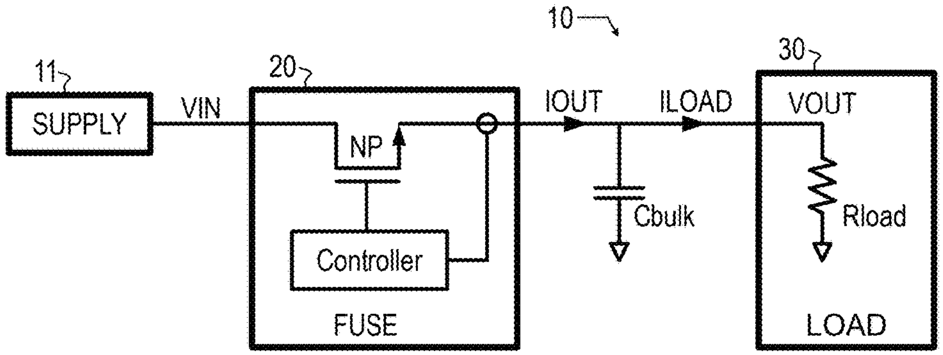
FIG. 1 is a block diagram of a prior art electronic fuse arrangement for powering a load.
Figure 2:
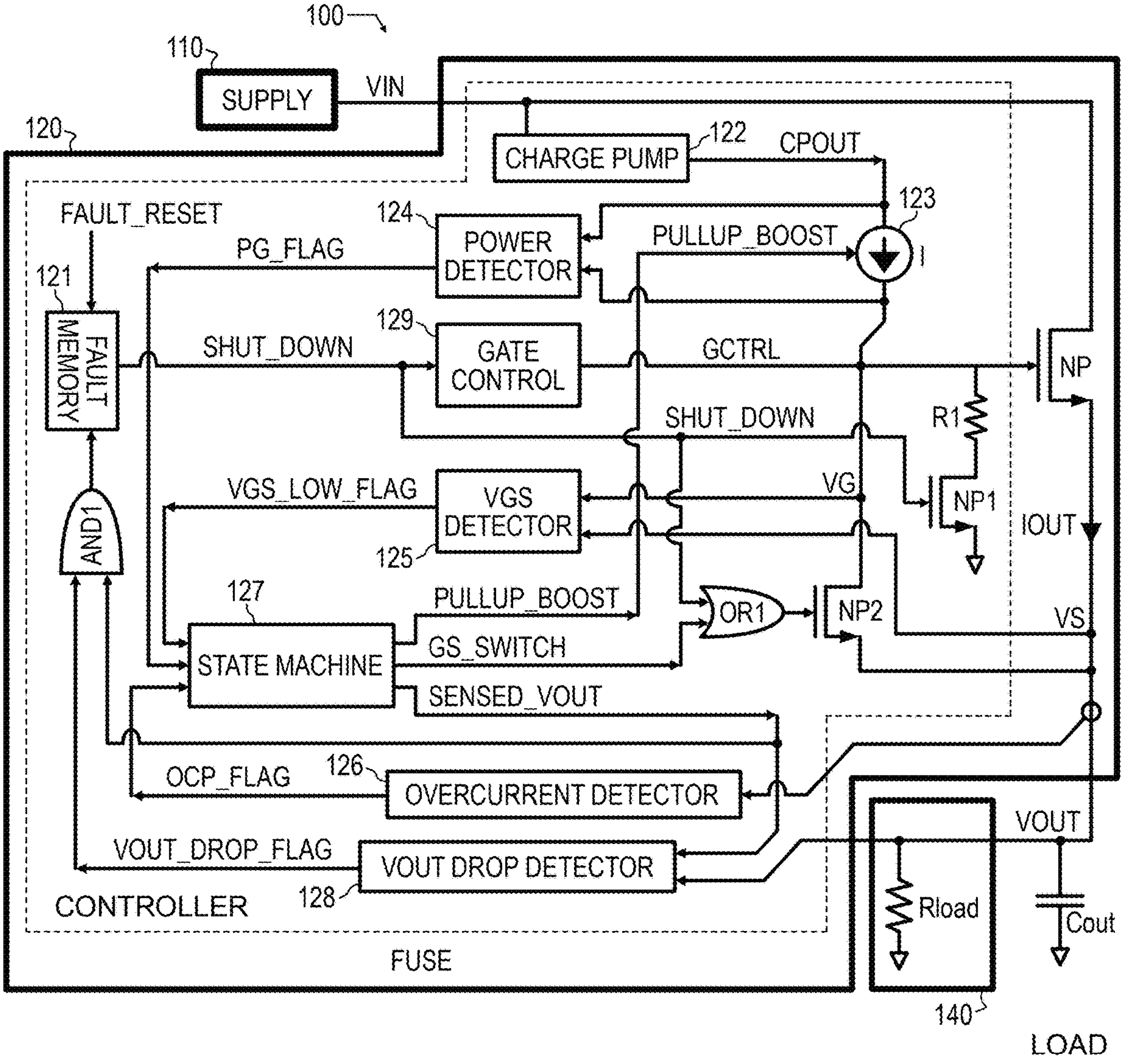
FIG. 2 is a block diagram of a power supply system described herein.

Now described in FIG. 2 is a power supply system 100 for powering a load 140 from a power supply 110, with an electronic fuse 120 controlling current flow from the power supply 110 to the load 140.

The electronic fuse 120 includes an n-channel power transistor NP to be protected, the power transistor NP having its drain connected to the supply 110 to receive the input voltage VIN, its source connected to the load 140 to provide the output voltage VOUT thereto, and its gate controlled by output from the gate control circuitry 129.

A charge pump 122 boosts the input voltage VIN to provide a charge pump output CPOUT to current source 123, which is connected to the gate of power transistor NP. A power detector 124 has inputs reading the voltage across the current source 123, and asserts or deasserts a power-good flag PG_FLAG based upon that reading.

A gate to source voltage (VGS) detector 125 has inputs connected to the gate of power transistor NP to read its gate voltage VG and to the source of power transistor NP to read its source voltage VS, and asserts or deasserts a VGS low flag VGS_LOW_FLAG based upon that reading.

An overcurrent detector 126 is connected to read the source current of power transistor NP (output current IOUT) and asserts or deasserts an overcurrent protection flag OCP_FLAG based upon that reading.

A state machine 127 has inputs reading PG_FLAG, VGS_LOW_FLAG, and OCP_FLAG, and based upon those readings, asserts or deasserts its output signals PULLUP_BOOST, GS_SWITCH_ and SENSED_VOUT.

An output voltage VOUT drop detector 128 is connected to read both the output voltage VOUT as well as a SENSED_VOUT signal from the state machine 127, and asserts or deasserts a VOUT_DROP_FLAG based upon that reading.

The gate control circuitry 129 is connected to read a shut down signal SHUT_DOWN received from fault memory 121 and based upon that reading, asserts or deasserts a gate control signal GCTRL provided to the gate of power transistor NP.

A first logic circuit AND1 receives as inputs SENSED_VOUT and VOUT_DROP_FLAG, performs a logical combination (for example, AND) operation thereon, and asserts or deasserts its output accordingly. The fault memory 121 receives the output of the first logic circuit AND1 as well as the fault reset signal FAULT_RESET and asserts or deasserts its output SHUT_DOWN based on those readings.

A first shut-down transistor, here an n-channel transistor NP1, has its drain coupled to the gate of power transistor NP through resistor R1 and its source grounded, with its gate being controlled by the SHUT_DOWN signal.

A second logic circuit OR1 receives as input the shut down signal SHUT_DOWN as well as GS_SWITCH, performs a logical combination (for example, OR) operation thereon, and asserts or deasserts its output accordingly.

A second shut-down transistor, here an n-channel transistor NP2, has its drain connected to the gate of power transistor NP and its source connected to the source of power transistor NP, with its gate being controlled by the output of the second logic circuit OR1.

Figure 3:
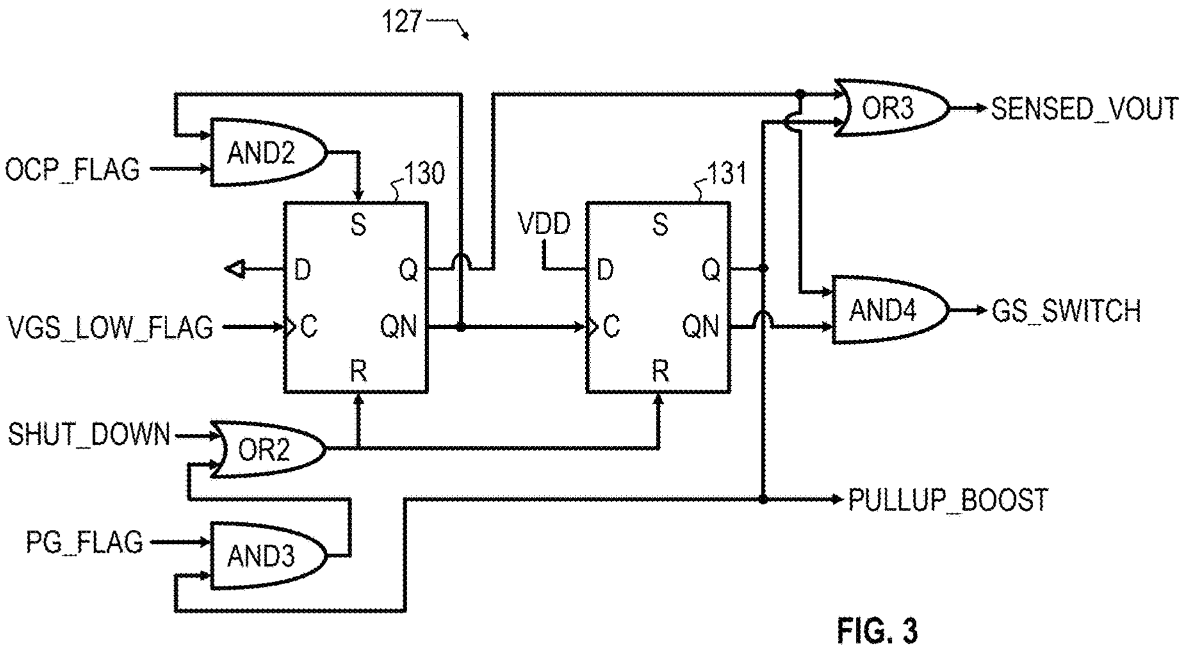
FIG. 3 is a block diagram of the state machine of the power supply system of FIG. 2.

The details of the state machine 127 are now described with additional reference to FIG. 3. The state machine 127 include first flip flop 130, for example a clocked D-type flip flop with active-high set and reset inputs, and second flip flop 131, for example a clocked D-type flip flop with an active high reset input.

Flip flop 130 has its data D input grounded, its clock input receiving VGS_LOW_FLAG as a clock signal, its reset input receiving the output of a third logic circuit OR2 as a reset signal, and its set input receiving the output of a fourth logic circuit AND2 as a set signal.

The third logic circuit OR2 receives, as input, the shut down signal SHUT_DOWN, as well as the output of fifth logic circuit AND3, performs a logical combination (for example, OR) operation thereon, and asserts or deasserts its output accordingly. The fifth logic circuit AND3 receives as input PG_FLAG, as well as PULLUP_BOOST, performs a logical combination operation (for example, AND) operation thereon, and asserts or deasserts its output accordingly. The fourth logic circuit AND2 receives as input OCP_FLAG, as well as the inverted output QN of the flip flop 130, performs a logical combination (for example, AND) operation thereon, and asserts or deasserts its output accordingly.

Flip flop 131 has its dataD input connected to the supply voltage VDD, its clock receiving the output of the QN output of flip flop 130 as a clock signal, its reset input receiving the output of the third logic circuit OR2 as a reset input.

A sixth logic circuit OR3 receives as input the non-inverted output Q of flip flop 130, as well as PULLUP_BOOST (which is the non-inverted output Q of flip flop 131), performs a logical combination (for example, OR) operation thereon, and asserts or deasserts SENSED_VOUT accordingly.

A seventh logic circuit AND4 receives as input the inverted output QN of flip flop 131 as well as the non-inverted output Q of flip flop 130, performs a logical combination (for example, AND) operation thereon, and asserts or deasserts GS_SWITCH accordingly.

Figure 4:
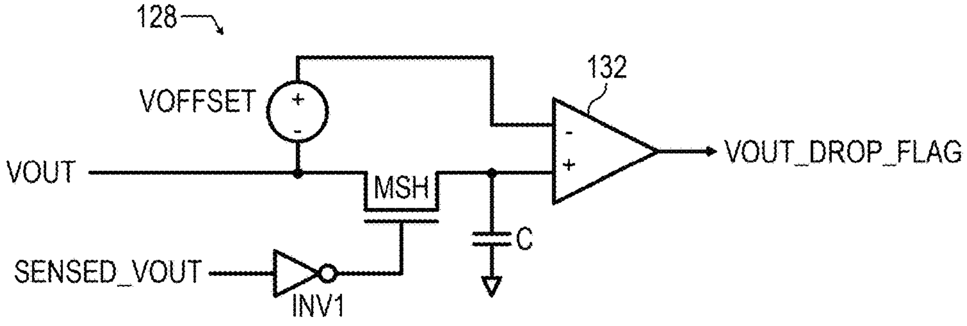
FIG. 4 is a schematic diagram of a first potential embodiment for the output voltage drop detector of FIG. 2.

Details of two potential configurations for the VOUT drop detector 128 are now described. The first potential configuration of VOUT drop detector 128 is shown in FIG. 4 and includes comparator 132 generating VOUT_DROP_FLAG at its output. The output voltage VOUT formed across output capacitor Couth has an offset VOFFSET added thereto, with the resulting voltage being provided to the inverting input of comparator 132. An n-channel transistor MSH is connected between the output voltage VOUT and the non-inverting input of comparator 132, with its gate being controlled by an inverted version of SENSED_VOUT (the inversion being performed by a logic circuit such as inverter INV1). A capacitor C is connected between the non-inverting input of comparator 132 and ground. In this configuration, when SENSED_VOUT is low, transistor MSH is turned on, allowing capacitor C to charge up to the output voltage VOUT. When SENSED_VOUT goes high, transistor MSH is turned off, and capacitor C holds the previous value of VOUT. Comparator 132 then compares this held value with the current output voltage VOUT plus an offset VOFFSET. If the current output voltage plus the offset drops below the held value, comparator 132 asserts VOUT_DROP_FLAG, indicating a significant drop in the output voltage.

Figure 5:
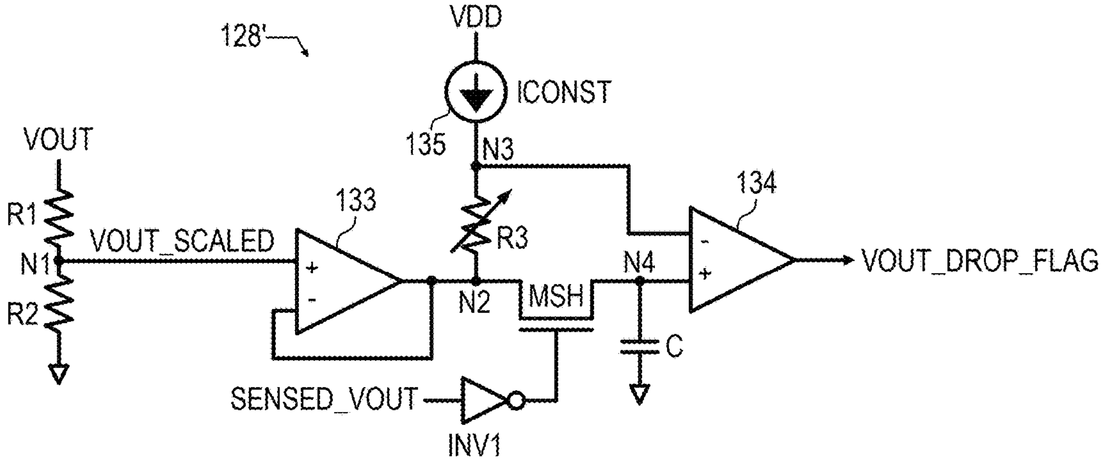
FIG. 5 is a schematic diagram of a second potential embodiment for the output voltage drop detector of FIG. 2.

The second potential configuration of VOUT drop detector 128' is shown in FIG. 5 and includes a voltage divider formed by resistors R1 and R2 connected in series between the output voltage VOUT and ground, with a scaled version VOUT_SCALED of the output voltage VOUT being formed at the tap N1 between R1 and R2. An amplifier 133 buffers VOUT_SCALED to its output at node N2. An adjustable resistor R3 is connected between nodes N3 and N2. A current source 135 sources a constant current ICONST to node N3. A comparator 134 has its inverting input connected to node N3 and its non-inverting input connected to node N4, and generates VOUT_DROP_FLAG based upon whether the voltage at N3 or N4 is higher. A capacitor C is connected between node N4 and ground. An n-channel transistor MSH is connected between nodes N2 and N4, with its gate being controlled by an inverted version of SENSED_VOUT (the inversion being performed by a logic circuit such as inverter INV1). In this configuration, when SENSED_VOUT is low, transistor MSH is turned on, allowing capacitor C to charge up to the scaled output voltage VOUT_SCALED. When SENSED_VOUT goes high, transistor MSH is turned off, and capacitor C holds the previous value of VOUT_SCALED. The held value on capacitor C is compared to the voltage at node N3, which is determined by the current ICONST flowing through adjustable resistor R3. If the voltage at node N3 drops below the held value on capacitor C, comparator 134 asserts VOUT_DROP_FLAG, indicating a significant drop in the output voltage.

Figure 6:
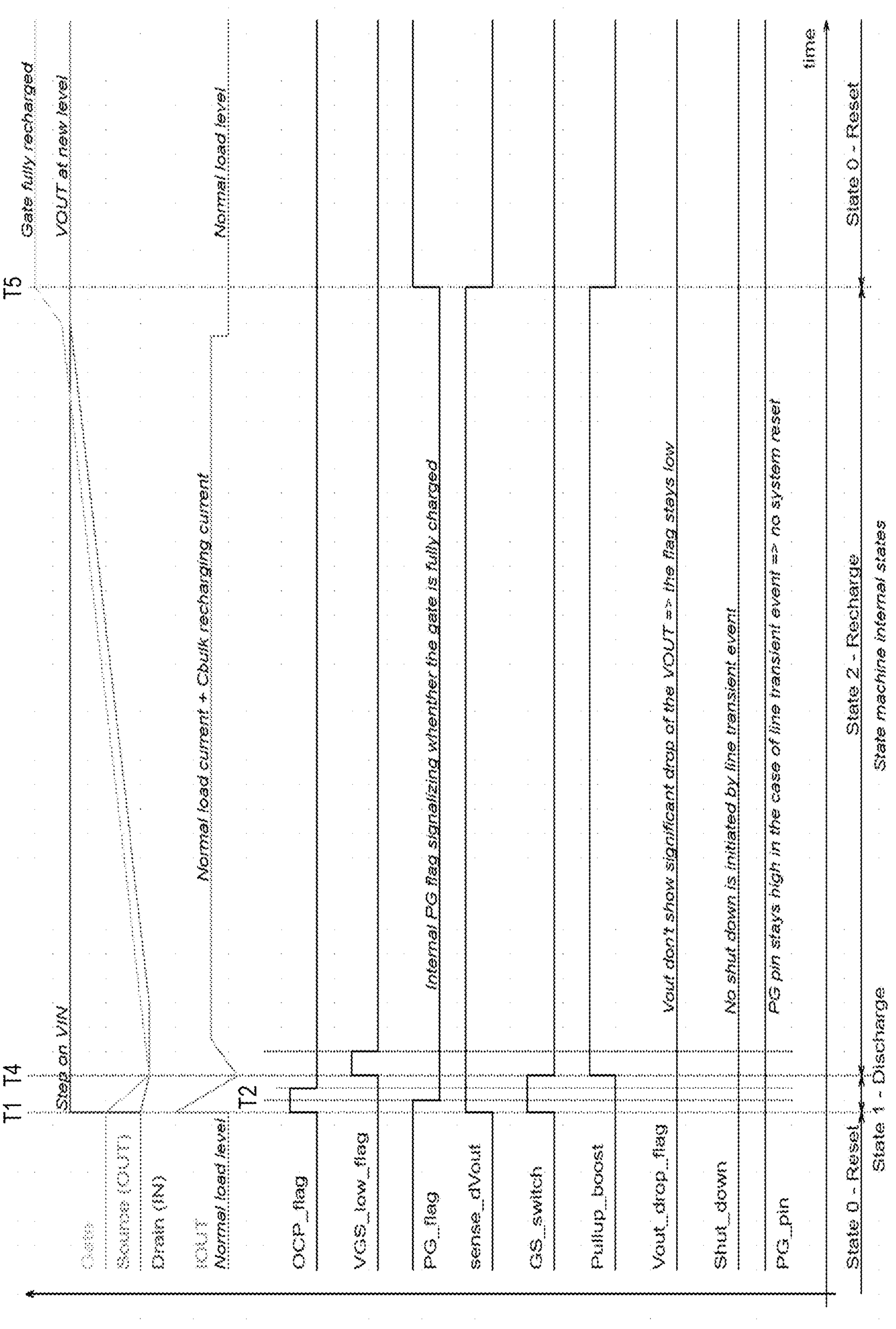
FIG. 6 shows a timing diagram of operation of the power supply system of FIG. 2 when an input transient occurs.

Referring now to FIGS. 2-4 for the circuitry functionality that will be described, as well as the graph/timing diagram of FIG. 6 showing the various voltages and flags, operation of the power supply system 100 in the case where overcurrent has resulted from a transient on the input is now described. In this example, when a signal is "asserted", it is set to a logic high, and when a signal is "deasserted", it is set to a logic low.

As shown in FIG. 6, prior to time T1, operation is normal and there is not an overcurrent condition. Signal states are as follows: the non-inverting output Q of flip flop 130 is a logic low (since VGS_LOW_FLAG and OCP_FLAG are both at a logic low); the non-inverting output Q of flip flop 131 (which sets PULLUP_BOOST) is at a logic low (since the inverting output QN of flip flop 130 is at a logic high); SENSED_VOUT is at a logic low (since the non-inverting output Q of flip flop 130 and PULLUP_BOOST are both are at a logic low); and GS_SWITCH is at a logic low (since either flip flop 131's inverting output QN is at a logic high or flip flop 130's non-inverting output Q is at a logic low).

At time T1, an overcurrent condition occurs, which can be seen as the spike in the output current IOUT shown in the graph of FIG. 6. This overcurrent condition is detected by the overcurrent detector 126 (e.g., because IOUT exceeds a threshold), which transitions OCP_FLAG to a logic high, setting the non-inverting output Q of flip flop 130 to a logic high (since VGS_LOW_FLAG is still at a logic low). The non-inverting output Q of flip flop 131 (which sets PULLUP_BOOST) remains at a logic low (since the inverting output QN of flip flop 130 is now at a logic low). As a result, SENSED_VOUT transitions to a logic high (since the non-inverting output Q of flip flop 130 is now at a logic high), and GS_SWITCH then transitions to a logic high (since the inverting output QN of flip flop 131 is at a logic high and the non-inverting output Q of flip flop 130 is at a logic high), beginning the discharge of the gate voltage of NP.

At time T2, GS_SWITCH being at a logic high causes assertion of the output of the first OR gate OR1 to a logic high, turning on transistor NP2, tying the gate and source of power transistor NP together. As a result, there is a voltage difference across current source 123, which causes the power detector 124 to deassert the PG_FLAG to a logic low. This does not affect the state of the flip flops 130, 131 or the various output signals.

By time T3, the output current IOUT has returned to (or fallen below) the threshold level, so the overcurrent detector 126 transitions the OCP_FLAG back to a logic low, but the non-inverting output Q of flip flop 130 remains at a logic high (since VGS_LOW_FLAG remains at a logic low, so the inverting output QN of flip flop 130 remains at a logic low, with the result being that the output of the second AND gate AND2 remains at a logic low). The other signals remain unchanged.

By time T4, the VGS detector 125 has sensed the gate and source voltages of the power transistor NP being close due to transistor NP2 being on, and therefore asserts VGS_LOW_FLAG to a logic high, clocking flip flop 130 and setting its non-inverting output Q to a logic low (since its D input is grounded). As a result, the non-inverting output Q of flip flop 131 (which sets PULLUP_BOOST) transitions to a logic high (since the inverting output QN of flip flop 130 is now at a logic high, clocking flip flop 131)—this turns on current source 123 to source a current I to the gate of power transistor NP to recharge its gate voltage. SENSED_VOUT remains at a logic high (since PULLUP_BOOST is now at a logic high), and GS_SWITCH transitions to a logic low (since the non-inverting output Q of flip flop 130 is now at a logic low). GS_SWITCH transitioning to a logic low causes the output of the first OR gate OR1 to transition to a logic low, turning off transistor NP2.

After T4 the gate starts to recharge. As soon as it rises slightly, above the VGS DETECTOR threshold, the VGS_LOW_FLAG is deasserted without further effect on the state machine.

By time T5, the gate of power transistor NP has been fully recharged Since the gate of power transistor NP has been charged back up, the voltage across current source 123 falls below a threshold, which is sensed by the power detector 124 so that it in turn asserts PG_FLAG to a logic high, resetting the flip flops 130 and 131, an resetting the state machine to its default state.

Notice that the load current IOUT does not drop below the normal load current level (threshold) during operation in the example of FIG. 6. This is because the overcurrent condition resulted from an input transient and the power transistor NP was able to withstand the conditions imposed by the transient by design.

Figure 7:
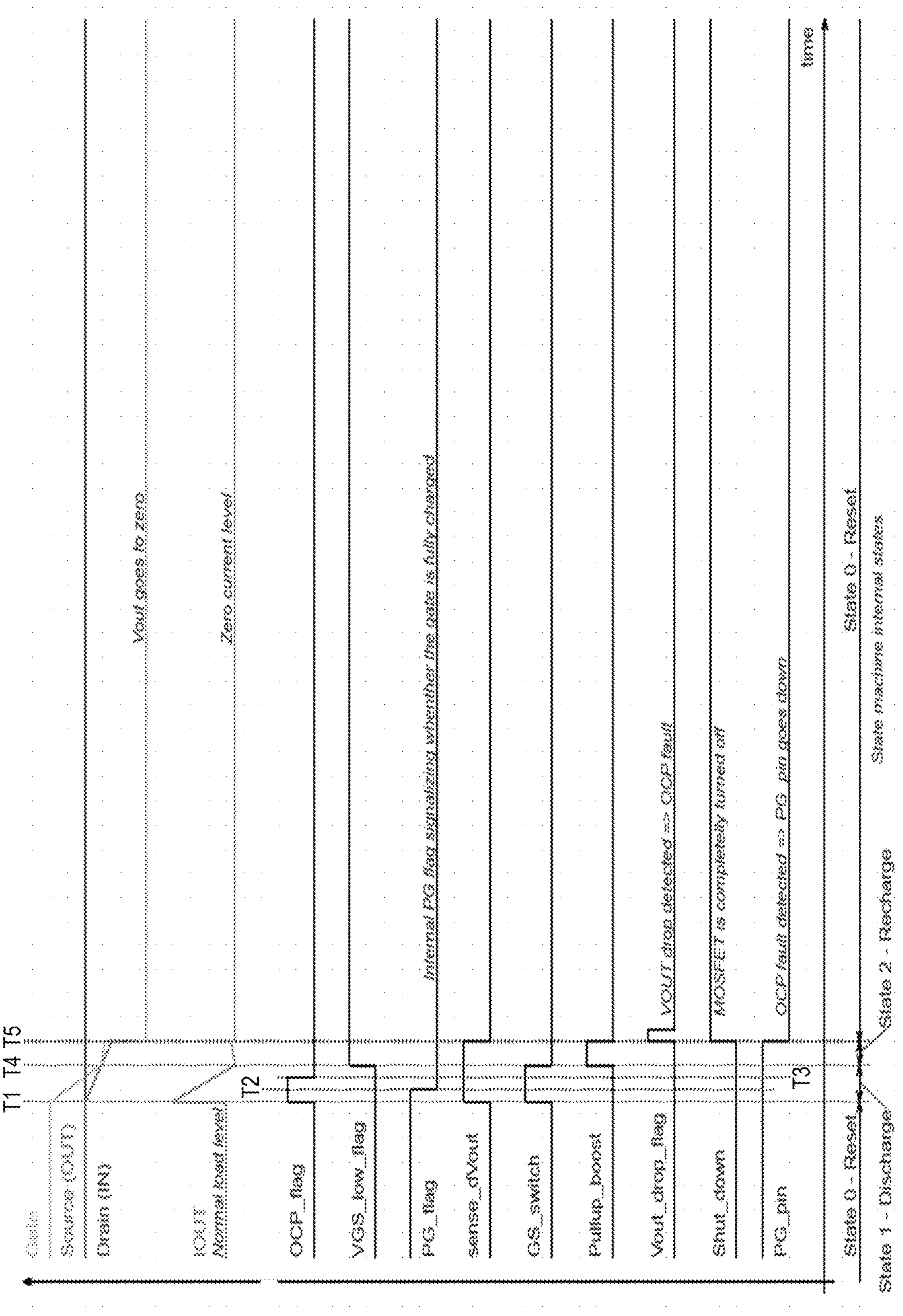
FIG. 7 shows a timing diagram of operation of the power supply system of FIG. 2 when an output short occurs.

Operation of the power supply system 100 in the case where overcurrent has resulted from a transient on the output is now described. Also in this example, when a signal is “asserted”, it is set to a logic high, and when a signal is “deasserted”, it is set to a logic low. As shown in FIG. 7, up through time T4, operation is as described above for the previous case.

However, at time T5, a sufficient drop in the output voltage VOUT is detected by the VOUT drop detector 128, which in turn asserts VOUT_DROP_FLAG to a logic high. At the same time, since SENSED_VOUT is also at a logic high, the output of the first AND gate AND1 is asserted to a logic high, causing the fault memory 121 to assert the SHUT_DOWN signal to a logic high, causing the gate control signal 129 to deassert GCTRL to a logic low, and turning on transistor NP1 to pull down the gate of power transistor NP, thereby turning off power transistor NP completely, causing the output current IOUT to drop to zero. Assertion of SHUT_DOWN to a logic high resets both flip flop 130 and flip flop 131 through the second OR gate OR2, regardless of the states of the other inputs. As a result, the non-inverting output Q of flip flop 130 is set to a logic low, and the non-inverting output Q of flip flop 131 (which sets PULLUP_BOOST) transitions to a logic low. SENSED_VOUT then transitions to a logic low (since both the non-inverting output Q of flip flop 130 and PULLUP_BOOST are now at a logic low).

Notice here that, as stated, the load current drops to zero during the operation in FIG. 7, as the overcurrent has resulted from a transient on the output and the power transistor NP is to be turned fully off to protect it.

In conclusion, the power supply system 100 with the electronic fuse 120 offers several advantages over the prior art. Through the use of the state machine 127 and a combination of input voltage VIN and output voltage VOUT monitoring through the VGS detector 125 and the VOUT drop detector 128, the system 100 is capable of reliably distinguishing between overcurrent conditions caused by input transients and those resulting from output short circuits. This allows for appropriate protection measures to be taken providing for the safety of the power transistor NP and the connected load 140. Moreover, the design minimizes the number of high voltage components (>5V), which simplifies the circuit, reduces cost, and improves overall reliability.

It is evident that modifications and variations can be made to what has been described and illustrated herein without departing from the scope of this disclosure.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A power supply system, comprising:

a power transistor having a first conduction terminal coupled to an input node configured to receive an input voltage, a second conduction terminal coupled to an output node configured to generate an output voltage, and a control terminal configured to receive a gate control signal;

a first shut-down transistor having a first conduction terminal coupled to the control terminal of the power transistor, a second conduction terminal coupled to ground, and a control terminal configured to receive a shut down signal;

a second shut-down transistor having a first conduction terminal coupled to the control terminal of the power transistor, a second conduction terminal coupled to the output node, and a control terminal;

a current source configured to source current to the control terminal of the power transistor in response to assertion of a pullup boost signal;

a power detector configured to assert a power-good flag when a voltage across the current source is at a minimum threshold;

a gate-to-source voltage detector configured to assert a low gate-to-source voltage flag when a gate-to-source voltage of the power transistor is below a gate-to-source threshold;

an overcurrent detector configured to assert an overcurrent protection flag based upon sensing an output current sourced by the power transistor to the output node;

an output voltage drop detector configured to assert an output voltage drop flag when the output voltage has fallen below a sampled output voltage by an offset;

a first logic circuit having a first input coupled to receive the output voltage drop flag, a second input coupled to receive a sensed output voltage flag, and an output;

a fault indication circuit configured to assert the shut down signal in response to assertion of the output of the first logic circuit;

a gate control circuit configured to generate the gate control signal as being asserted when the shut down signal is deasserted but as being deasserted when the shut down signal is asserted;

a state machine configured to generate the pullup boost signal, a gate-to-source switch signal, and a sensed output voltage flag based upon the low gate-to-source voltage flag, the power-good flag, and the overcurrent protection flag; and a second logic circuit having a first input coupled to receive the gate-to-source switch signal, a second input coupled to receive the shut down signal, and an output coupled to the control terminal of second shut-down transistor.

2. The power supply system of claim 1, wherein the state machine comprises:

a third logic circuit having a first input receiving the power-good flag, a second input receiving the pullup boost signal, and an output;

a fourth logic circuit having a first input receiving the output of the third logic circuit, a second input receiving the shut down signal, and an output;

a first flip flop having a data input coupled to ground, a clock input coupled to the low gate-to-source voltage flag, a reset input coupled to the output of the fourth logic circuit, a set input, a non-inverting data output, and an inverting data output;

a second flip flop having a data input coupled to a supply voltage node, a clock input coupled to the non-inverting data output of the first flip flop, a reset input coupled to the output of the fourth logic circuit, a non-inverting data output at which the pullup boost signal is generated, and an inverting data output;

a fifth logic circuit having a first input receiving the overcurrent protection flag, a second input receiving the inverting data output of the first flip flop, and an output coupled to the set input of the first flip flop;

a sixth logic circuit having a first input coupled to the non-inverting data output of the first flip flop, a second input coupled to the non-inverting data output of the second flip flop, and an output at which the sensed output voltage flag is produced; and a seventh logic circuit gate having a first input coupled to the non-inverting data output of the first flip flop, a second input coupled to the inverting data output of the second flip flop, and an output at which the gate-to-source switch signal is generated.

3. The power supply system of claim 1, wherein the first logic circuit is a first AND gate and the second logic circuit is a first OR gate.

4. The power supply system of claim 3, wherein the state machine comprises:

a third AND gate having a first input receiving the power-good flag, a second input receiving the pullup boost signal, and an output;

a second OR gate having a first input receiving the output of the third AND gate, a second input receiving the shut down signal, and an output;

a first flip flop having a data input coupled to ground, a clock input coupled to the low gate-to-source voltage flag, a reset input coupled to the output of the second OR gate, a set input, a non-inverting data output, and an inverting data output;

a second flip flop having a data input coupled to a supply voltage node, a clock input coupled to the non-inverting data output of the first flip flop, a reset input coupled to the output of the second OR gate, a non-inverting data output at which the pullup boost signal is generated, and an inverting data output;

a second AND gate having a first input receiving the overcurrent protection flag, a second input receiving the inverting data output of the first flip flop, and an output coupled to the set input of the first flip flop;

a third OR gate having a first input coupled to the non-inverting data output of the first flip flop, a second input coupled to the non-inverting data output of the second flip flop, and an output at which the sensed output voltage flag is produced; and a fourth AND gate having a first input coupled to the non-inverting data output of the first flip flop, a second input coupled to the inverting data output of the second flip flop, and an output at which the gate-to-source switch signal is generated.

5. The power supply system of claim 1, wherein the output voltage drop detector comprises:

a comparator having an inverting input terminal coupled to receive a representative voltage equal to the output voltage plus an offset voltage, a non-inverting input terminal, and an output terminal at which the output voltage drop flag is generated;

a sampling capacitor coupled between the non-inverting input terminal of the comparator and ground, the sampling capacitor configured to store the sampled output voltage; and a sampling transistor configured to selectively couple the output voltage to the non-inverting input terminal of the comparator, based upon the sensed output voltage flag.

6. The power supply system of claim 1, wherein the output voltage drop detector comprises:

a voltage dividing ladder coupled between the output voltage and ground, with a scaled version of the output voltage formed at a first node, the first node being a tap of the voltage dividing ladder;

a buffer coupled between the first node and a second node;

a resistance coupled between the second node and a third node;

a current source configured to source a constant current to the third node;

a comparator having an inverting input terminal coupled to the third node, a non-inverting input terminal coupled to a fourth node, and an output at which the output voltage drop flag is generated;

a sampling capacitor coupled between the fourth node and ground; and a sampling transistor configured to selectively couple the second node to the fourth node, based upon the sensed output voltage flag.

7. A method for distinguishing between overcurrent conditions in a power supply system, the method comprising:

detecting an overcurrent condition and asserting an overcurrent protection flag;

asserting a sensed output voltage signal and a gate-to-source switch signal to discharge a gate of a power transistor;

detecting a gate-to-source voltage of the power transistor below a threshold and asserting a gate-to-source voltage low flag;

charging the gate of the power transistor in response to the gate-to-source voltage low flag;

detecting a drop in output voltage while the sensed output voltage signal is asserted and asserting an output voltage drop flag; and shutting down the power transistor if the output voltage drop flag is asserted while the sensed output voltage signal is asserted.

8. The method of claim 7, further comprising:

resetting the sensed output voltage signal and the gate-to-source switch signal if the overcurrent condition ends and the gate-to-source voltage rises above the threshold before the output voltage drop flag is asserted.

9. The method of claim 7, wherein detecting the drop in output voltage comprises:

holding a previous value of the output voltage when the sensed output voltage signal is deasserted;

comparing a current value of the output voltage plus an offset to the held previous value; and asserting the output voltage drop flag if the current value plus the offset drops below the held previous value.

10. The method of claim 7, wherein detecting the drop in output voltage comprises:

generating a scaled version of the output voltage;

holding a previous value of the scaled version of the output voltage when the sensed output voltage signal is deasserted;

generating a comparison voltage from the scaled version of the output voltage and a current source; and asserting the output voltage drop flag if the comparison voltage drops below the held previous value.

11. The method of claim 7, wherein asserting the sensed output voltage signal and the gate-to-source switch signal comprises:

setting a first flip flop in response to the overcurrent protection flag being asserted;

asserting the sensed output voltage signal in response to an output of the first flip flop being asserted; and asserting the gate-to-source switch signal in response to the output of the first flip flop and an inverted output of a second flip flop being asserted.

12. The method of claim 11, wherein charging the gate comprises:

setting the second flip flop in response to the gate-to-source voltage low flag being asserted; and enabling a current source to charge the gate in response to an output of the second flip flop being asserted.

* * * * *